(12) United States Patent
Asai et al.

(10) Patent No.: US 6,762,921 B1
(45) Date of Patent: Jul. 13, 2004

(54) MULTILAYER PRINTED-CIRCUIT BOARD AND METHOD OF MANUFACTURE

(75) Inventors: Motoo Asai, Gifu (JP); Kouta Noda, Gifu (JP); Takashi Kariya, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/926,476

(22) PCT Filed: May 13, 1999

(86) PCT No.: PCT/JP99/02488

§ 371 (c)(1),
(2), (4) Date: Nov. 9, 2001

(87) PCT Pub. No.: WO00/70925

PCT Pub. Date: Nov. 23, 2000

(51) Int. Cl.⁷ .............................. H02H 3/22; B32B 3/10
(52) U.S. Cl. ....................................... 361/111; 428/131
(58) Field of Search ................................ 361/111, 112; 428/131, 209, 901

(56) References Cited

U.S. PATENT DOCUMENTS

| | | | | |
|---|---|---|---|---|
| 5,571,365 A | * | 11/1996 | Maehata et al. ............ 156/326 |
| 5,827,604 A | * | 10/1998 | Uno et al. .................. 428/209 |
| 6,217,987 B1 | * | 4/2001 | Ono et al. .................. 428/209 |
| 6,440,542 B1 | * | 8/2002 | Kariya ........................ 428/209 |
| 6,441,314 B2 | * | 8/2002 | Rokugawa et al. ......... 174/255 |
| 6,541,301 B1 | * | 4/2003 | Raymond .................... 438/106 |

FOREIGN PATENT DOCUMENTS

| | | |
|---|---|---|
| JP | 61163691 | 7/1986 |
| JP | 6-177511 | 6/1994 |
| JP | 9-223859 | 8/1997 |
| JP | 9-246730 | 9/1997 |
| JP | 9-246732 | 9/1997 |
| JP | 10261869 | 9/1998 |
| JP | 11-68308 | 3/1999 |

OTHER PUBLICATIONS

English Language Abstract of JP 11–68308.
English Language Abstract of JP 61–163691.
English Language Abstract of JP 6–177511.
English Language Abstract of JP 9–246732.
English Language Abstract of JP 10–261869.
English Language Abstract of JP 9–246730.
English Language Abstract of JP 9–223859.

* cited by examiner

*Primary Examiner*—Brian Sircus
*Assistant Examiner*—Danny Nguyen
(74) *Attorney, Agent, or Firm*—Greenblum & Bernstein, P.L.C.

(57) ABSTRACT

This invention is to propose a technique of producing a printed wiring board having an excellent adhesion property between an electroless plated film and an electrolytic plated film constituting a conductor circuit through a semi-additive process without causing the peeling of a plating resist and is a printed wiring board comprising conductor circuits formed on a roughened surface of an insulating layer, in which the conductor circuit is constituted with an electroless plated film at the side of the insulating layer and an electrolytic plated film at the opposite side and the electroless plated film located at the side of the insulating layer is formed so as to follow to the roughened surface of the insulating layer. This printed wiring board is produced by a semi-additive method wherein the electroless plated film is formed on the roughened surface of the insulating layer so as to follow to the roughened surface of the insulating layer.

14 Claims, 4 Drawing Sheets

FIG. 12

MULTILAYER PRINTED-CIRCUIT BOARD AND METHOD OF MANUFACTURE

TECHNICAL FIELD

This invention relates to a multilayer printed wiring board and a method of producing the same, and more particularly it proposes a technique wherein a multilayer printed wiring board having an excellent adhesion property between electroless plated film and electrolytic plated film constituting a conductor circuit is produced by a semi-additive process without causing the peeling of a plating resist.

BACKGROUND ART

The semi-additive process is a method wherein a surface of an insulating layer is first subjected to am electroless plating, and a plating resist is formed, and an electrolytic plating is conducted by flowing current to the electroless plated film corresponding to a portion not forming the plating resist, and the electroless plated film beneath the plating resist is dissolved and removed by an etching treatment to from a conductor circuit consisting of the electroless plated film and the electrolytic plated film.

In the production method of the printed wiring board by the semi-additive process, however, when oxide film or fats and oils adheres onto the surface of the electroless plated film, if the electrolytic plated film is formed on the surface of the electroless plated film, the peeling or the like is apt to be caused at the boundary face therebetween. Particularly, the peeling is considerably caused through heat cycle, thermal shock and the like.

In the conventional semi-additive process, the surface of the electroless plated film is smooth, so that when the plating resist is formed on the surface of the electroless plated film, it is easily peeled off and there is a problem of causing short-circuit between conductor patterns.

For this end, such a problem can be solved by roughening the surface of the insulating layer and following the electroless plated film to the roughened surface.

However, if it is intended to follow the electroless plated film to the roughened surface of the insulating layer, it is required to hardly form the plated film in recess portions of the roughened surface. Because, when the plated film is simply precipitated in these recess portions, the roughened surface becomes flat.

As such an electroless plating, there is an electroless copper plating using EDTA. For example, there is Build Copper (trade name, made by Okuno Seiyaku Co., Ltd.) as disclosed in JP-A-11-68308.

When the multilayer printed wiring board is produced by using such a plating, if the diameter of theviahole is not more than 90 μm, the wiring breakage is observed in the viahole portion.

The invention is to solve the aforementioned problems inherent to the semi-additive process. A main object of the invention is to provide a multilayer printed wiring board capable of controlling the peeling produced at the boundary face between the electroless plated film and the electrolytic plated film constituting the conductor circuit by the semi-additive process through heat cycle or thermal shock to completely prevent the wiring breakage in the viahole portion.

Another object of the invention is to propose a technique capable of surely preventing the peeling of the plating resist at the production step of the printed wiring board by the semi-additive process.

DISCLOSURE OF THE INVENTION

The inventors have made various studies in order to achieve the above objects and discovered that the occurrence of such a wiring breakage is surprisingly caused due to the following mechanism.

When the electroless plated film is precipitated so as to follow to the roughened surface of the insulating layer, since such an electroless plated film hardly precipitates in the recess portions of the roughened surface, it is natural that the precipitation of the plated film hardly occurs in the inside of the viahole.

Particularly, there has been discovered a quite surprising fact that this tendency becomes conspicuous when the average diameter of the viahole is not more than 90 μm and the thickness of the electroless plated film formed on of the surface portion of the interlaminar resin insulating layer is less than 50% of the thickness of the electroless plated film at the bottom of the viahole.

At such a state, the electrolytic plated film is not precipitated or the viahole is peeled off to lower the connection reliability of the viahole portion.

Now, the inventors have further studied and found that the precipitation rate of the electroless plated film is adjusted to not more than 2 μm/hour, whereby the electroless plated film can be followed to the roughened surface of the insulating layer and at the same time the thickness of the electroless plated film at the bottom of theviahole can be adjusted to 50~100% of that of the electroless plated film formed on the interlaminar resin insulating layer surface and as a result, the invention has been accomplished.

The method of adjusting the precipitation rate of the electroless plated film to not more than 2 μm/hour is not particularly restricted. For example, there are a method of adjusting the temperature of the plating solution to not higher than 50° C., a method of using a tartrate as a complex agent for the plating, and the like. The invention will be described in detail below.

The invention lies in a multilayer printed wiring board comprising a substrate provided with inner conductor circuits, an interlaminar resin insulating layer formed thereon and outer conductor circuits and viaholes formed in the interlaminar resin insulating layer, characterized in that a roughened surface is formed on the surface of the interlaminar resin insulating layer, the outer conductor circuit is comprised of an electroless plated film formed following to the roughened surface and an electrolytic plated film formed on the electroless plated film and the viahole has an average diameter of not more than 90 μm, and a thickness of the electroless plated film at the bottom of theviahole is 50~100% of a thickness of the electroless plated film at the surface of the interlaminar resin insulating layer.

Further, the invention lies in a method of producing a multilayer printed wiring board, which comprises forming an interlaminar resin insulating layer on a substrate provided with inner conductor circuits, forming an opening having an average diameter of not more than 90 μm in the interlaminar resin insulating layer, roughening the surface of the interlaminar resin insulating layer, subjecting to an electroless plating to form an electroless plated film so as to follow to the roughened surface on the surface of the interlaminar resin insulating layer, and at the same time subjecting the inside of the opening to an electroless plating to adjust a thickness of the electroless plated film at the bottom of aviahole to 50~100% of a thickness of the electroless plated film on the surface of the interlaminar resin insulating layer, forming a plating resist, subjecting portions not forming the plating resist to an electrolytic plating, removing the plating resist, and removing the electroless plated film beneath the plating resist through etching to form an outer conductor circuit and viaholes comprised of the electroless plated film and the electrolytic plated film.

BEST MODE FOR CARRYING OUT THE INVENTION

The multilayer printed wiring board according to the invention is a multilayer printed wiring board comprising a substrate provided with inner conductor circuits, an interlaminar resin insulating layers formed thereon and outer conductor circuits and viaholes formed in the interlaminar resin insulating layer, characterized in that a roughened surface is formed on the surface of the interlaminar resin insulating layer, the outer conductor circuit is comprised of an electroless plated film formed following to the roughened surface and an electrolytic plated film formed on the electroless plated film and the viahole has an average diameter of not more than 90 μm, and a thickness of the electroless plated film at the bottom of the viahole is 50~100% of a thickness of the electroless plated film at the surface of the interlaminar resin insulating layer.

According to such a construction, the electroless plated film formed on the interlaminar resin insulating layer becomes uneven in its surface and strongly adheres to the electrolytic plated film serving the unevenness as an anchor. Therefore, there is caused no peeling through heat cycle or thermal shock at a boundary face between the electroless plated film and the electrolytic plated film.

And also, according to the above construction, the plating resist adheres to the electroless plated film having the uneven surface, so that the peeling hardly occurs at a boundary face to the electroless plated film. For this end, there is not caused short-circuit between the conductor circuits in the production course of the printed wiring board by semi-additive method.

Furthermore, even when the average diameter of the viahole is not more than 90 μm, the thickness of the electroless plated film at the bottom of theviahole is 50~100% of the thickness of the electroless plated film on the surface of the interlaminar resin insulating layer, so that the unprecipitation of the electrolytic plated film and wire breakage in the viahole portion can be prevented.

In the invention, it is favorable that the electroless plated film constituting the outer conductor circuit has a thickness of 0.1~5 μm, more particularly 0.5~5 μm. When the thickness is too thick, the followability of the interlaminar resin insulating layer lowers, while when it is too thin, the lowering of peeling strength is caused, and the resistance value becomes large to cause the scattering of the plated film thickness in case of being subjected to the electrolytic plating.

And also, the thickness of the electrolytic plated film constituting the outer conductor circuit is desirable to be 5~30 μm, preferably 10~20 μm. When the thickness is too thick, the lowering of peel strength is caused, while when it is too thin, the electric resistance becomes higher.

In the invention, it is desirable that the roughened layer is formed on the surface of the inner and outer conductor circuit. Because, an adhesion to the interlaminar insulating layer as an upper layer is excellent.

The roughened layer is desirable to be a roughened surface formed by an etching treatment, a polishing treatment, an oxidation treatment, or an oxidation-reduction treatment, or a roughened surface formed by a plated film.

Particularly, the roughened layer is desirable to be a layer of copper-nickel-phosphorus alloy. Because, the alloy layer is a needle-shaped layer and is excellent in the adhesion property to the interlaminar insulating layer.

The composition of the alloy layer is desirable to be a ratio of copper to nickel to phosphorus of 90~96 wt % to 1~5 wt % to 0.5~2 wt %. In such a composition ratio, the alloy layer has a needle-shaped structure.

In case of forming the roughened layer by the oxidation treatment, it is desirable to use an oxidizing agent solution containing sodium chlorite, sodium hydroxide and sodium phosphate.

In case of forming the roughened layer by the oxidation-reduction treatment, it is desirable to conduct the immersion in a reducing agent solution containing sodium hydroxide and sodium borohydride after the above oxidation treatment.

The roughened layer formed on the surface of the conductor circuit is desirable to have a thickness of 1~10 μm, more particularly 1~5 μm. When the thickness is too thick, the roughened layer itself is apt to be damaged or peeled off, while when it is too thin, the adhesion property lowers.

In the invention, it is desirable to use an adhesive for electroless plating as the above insulating layer or interlaminar insulating layer. The adhesive for electroless plating is optimum to be formed by dispersing cured heat-resistant resin particles soluble in an acid or oxidizing agent into uncured heat-resistant resin hardly soluble in the acid or oxidizing agent after the curing. Because, when being treated with the acid or oxidizing agent, the heat-resistant resin particles are dissolved and removed, whereby the roughened surface having octopus trap-shaped anchors in its surface can be formed.

The depth of the roughened surface is favorable to be 0.01~20 μm for ensuring the adhesion property. And also, it is 0.1~5 μm in the semi-additive process. Such a range can remove the electroless plated film while ensuring the adhesion property.

As the cured heat-resistant resin particles in the adhesive for electroless plating, it is desirable to use at least one selected from the group consisting of ① heat-resistant resin powder having an average particle size of not more than 10 μm, ② aggregate particles of heat-resistant resin powder having an average particle size of not more than 2 μm, ③ a mixture of heat-resistant resin powder having an average particle size of not more than 10 μm and heat-resistant resin powder having an average particle size of not more than 2 μm, ④ false particles obtained by adhering at least one of heat-resistant resin powder and inorganic powder having an average particle size of not more than 2 μm to a surface of heat-resistant resin powder having an average particle size of 2~10 μm, and ⑤ a mixture of heat-resistant resin particles having an average particle size of 0.1~0.8 μm and heat-resistant resin powder having an average particle size of more than 0.8 μm but less than 2 μm. These particles can form more complicated anchors.

Then, a method of producing the printed wiring board according to the invention will be described.

(1) There is first prepared a wiring board wherein innerlayer copper pattern is formed on a surface of ac ore substrate. The formation of the copper pattern on the core substrate is carried out by etching a copper clad laminate, or by forming an adhesive layer for electroless plating on a substrate such as glass epoxy resin substrate, polyimide substrate, ceramic substrate, metal substrate or the like, roughening the surface of the adhesive layer and subjecting the roughened surface to an electroless plating, or by so-called semi-additive method (a method wherein the electroless plating is carried out over a whole of the roughened surface to form a plating resist and portions not forming the plating resist is subjected to an electrolytic plating and the plating resist is removed and an etching treatment is carried out to form conductor circuit comprised of electrolytic plated film and electroless plated film).

If necessary, a roughened layer made of copper-nickel-phosphorus is formed on the copper pattern surface (underlayer conductor circuit surface) of the wiring board.

The roughened layer is formed by electroless plating. An aqueous solution for the electroless plating is desirable to have a composition that concentrations of copper ion, nickel ion and hypophosphite ion are $2.2 \times 10^{-2} \sim 4.1 \times 10^{-2}$ mol/l, $2.2 \times 10^{-3} \sim 4.1 \times 10^{-3}$ mol/l and 0.20~0.25 mol/l, respectively.

It is desirable to form the roughened layer by either one of polishing treatment, etching treatment, graphitization-reduction treatment and plating treatment as the roughening method. In case of the graphitization-reduction treatment among these treatments, the roughened surface is desirable to be formed by using a graphitization bath (oxidation bath) made of an aqueous solution containing NaOH (20 g/l), $NaClO_2$ (50 g/l) and $Na_3PO_4$ (15.0 g/l) and a reduction bath made of an aqueous solution containing NaOH (2.7 g/l) and $NaBH_4$ (1.0 g/l).

In case of forming the roughened layer by the plating treatment, it is desirable that the electroless plating is carried out in an electroless plating bath of pH=9 containing copper sulfate (1~40 g/l), nickel sulfate (0.1~6.0 g/l), citric acid (10~20 g/l), sodium hypophosphite (10~100 g/l), boric acid (10~40 g/l) and a surfactant (Surfinol 465, trade name, made by Nisshin Kagaku Kogyo Co., Ltd.) to from a roughened layer made of Cu—Ni—P alloy. In this case, the precipitated film has a needle-shaped crystal structure and is excellent in the anchor effect. The electroless plating bath may contain a complexing agent and additives in addition to the above compounds.

As the method of forming the roughened layer by the etching treatment, there is mentioned a method wherein the surface of the conductor circuit is roughened by using an etching solution containing copper(II) complex and organic acid under co-existence of oxygen. In this case, the etching proceeds according to chemical reactions represented by the following equations (1) and (2):

wherein A is a complexing agent (acting as a chelate agent) and n is a coordination number.

As the copper(II) complex, it is desirable to use copper(II) complex of an azole. Such a copper(II) complex of the azole acts as an oxidizing agent for oxidizing metallic copper or the like. As the azole, mention may be made of diazoles, triazoles and tetraazoles. Among them, imidazole, 2-methylimidazole, 2-ethylimidazole, 2-ethyl-4-methylimidazole, 2-phenylimidazole, 2-undecylimidazole and the like are desirable. The content of the copper(II) complex of the azole in the etching solution is desirable to be 1~15% by weight. Because, it is excellent in the solubility and stability and can dissolve a noble metal such as palladium or the like constituting a catalyst nucleus.

And also, the organic acid is compounded with the copper(II) complex of the azole for dissolving the copper oxide. As the organic acid, mention may be made of formic acid, acetic acid, propioninc acid, butyric acid, valeric acid, caproic acid, acrylic acid, crotonic acid, citric acid, malonic acid, succinic acid, glutaric acid, maleic acid, benzoic acid, glycolic acid, lactic acid, malic acid, sulfamic acid and the like. These acids may be used alone or in admixture of two or more acids.

The content of the organic acid in the etching solution is desirable to be 0.1~30% by weight in order to maintain the solubility of the oxidized copper and ensure the dissolution stability. As shown by the above equation (2), the resulting copper(I) complex is dissolved by the action of the acid and bonded to oxygen to form a copper (II) complex, which again contributes to the oxidation of copper.

In order to assist the dissolution of copper and the oxidation action of the azole, a halogen ion such as fluorine ion, chlorine ion, bromine ion or the like may be added to the etching solution. And also, the halogen ion may be fed by adding hydrochloric acid, sodium chloride or the like. The amount of the halogen ion in the etching solution is desirable to be 0.01~20% by weight because the adhesion property between the roughened surface and the interlaminar resin insulating layer is excellent in this range.

In the preparation of the etching solution, the copper(II) complex of the azole and the organic acid (if necessary, halogen ion) are dissolved in water. As the etching solution, a commercially available etching solution, e.g. "Mech Etchbond", trade name, made by Mech Corporation may be used. In case of using the etching solution, the etching quantity is 0.1~10 μm, preferably 1~5 μm. When the etching quantity exceeds 10 μm, the bad connection between the roughened surface and the viahole conductor is caused, while when it is less than 0.1 μm, the adhesion property to the interlaminar resin insulating layer formed thereon becomes insufficient.

The roughened layer or the roughened surface may be covered with a layer of a metal or a noble metal having an ionization tendency larger than copper but not larger than titanium (hereinafter referred to as a metal layer). As such a metal, mention may be made of titanium, aluminum, zinc, iron, indium, thallium, cobalt, nickel, tin, lead, bismuth and the like. As the noble metal, mention may be made of gold, silver, platinum, palladium and the like. They may be used alone or in a combination of two or more to form plural layers.

The metal layer covers the roughened layer and obstructs the local electrode reaction in the roughening treatment of the interlaminar resin insulating layer to prevent the dissolution of the conductor circuit. The thickness of the metal layer is desirable to be 0.1~2 μm.

Among the metals constituting the metal layer, tin is desirable. Tin can form a thin layer by electroless substitution plating and follow to the roughened layer.

In the formation of the metal layer made of tin, the substitution plating is carried out by using a solution containing tin borofluoride and thiourea or a solution containing tin chloride and thiourea. In this case, Sn layer of about 0.1~2 μm is formed by Cu—Sn substitution reaction.

In the formation of the metal layer made of the noble metal, there can be adopted sputtering method, vapor deposition method and the like.

In this case, the precipitated film has a needle-shaped crystal structure and is excellent in the anchor effect. The electroless plating bath may contain a complexing agent and additives in addition to the above compounds.

Moreover, a through-hole is formed in the core substrate, and wiring layers on the front and rear surfaces can electrically be connected to each other through the through-hole.

And also, a resin may be filled in the through-hole and between the conductor circuits of the core substrate to ensure the smoothness.

(2) Then, an interlaminar resin insulating layer is formed on the wiring board prepared in the item (1).

In the invention, it is particularly desirable to use the aforementioned adhesive for electroless plating as a material of the interlaminar resin insulating layer.

(3) After the adhesive layer for electroless plating formed in the item (2) is dried, an opening for the formation of a viahole is formed, if necessary.

In this case, the opening portion for the formation of theviahole is formed in the adhesive layer by exposing to a light, developing and thermosetting in case of a photosensitive resin, or by thermosetting and exposing to a laser beam in case of a thermosetting resin.

(4) Next, epoxy resin particles existing on the surface of the adhesive layer are dissolved and removed with an acid or an oxidizing agent to roughen the surface of the adhesive layer.

As the acid, there are phosphoric acid, hydrochloric acid, sulfuric acid and organic acids such as formic acid, acetic acid and the like. Particularly, the use of the organic acid is desirable because it hardly corrodes a metal conductor layer exposed from the viahole in the roughening. As the oxidizing agent, it is desirable to use chromic acid and permanganate (potassium permanganate or the like).

(5) Then, a catalyst nucleus is applied to the wiring board provided with the roughened surface of the adhesive layer.

In the application of the catalyst nucleus, it is desired to use a noble metal ion, a noble metal colloid or the like. In general, palladium chloride or palladium colloid is used.

Moreover, it is desirable to conduct a heating treatment for fixing the catalyst nucleus. As the catalyst nucleus, palladium is favorable.

(6) Next, the surface of the adhesive layer for electroless plating is subjected to an electroless plating to form an electroless plated film followed to the whole of the roughened surface. In this case, the thickness of the electroless plated film is 0.1~5 μm, preferably 0.5~3 μm.

The electroless plating solution is an aqueous solution containing an alkali compound, a reducing agent, copper ion and tartaric acid or a salt thereof.

Since tartaric acid or a salt thereof is used in the electroless plating solution, the plated film is hardly precipitated in the recess portion of the roughened surface and hence the electroless plated film is obtained along the roughened surface. And also, the precipitation rate is very slow (1~2 μm/hour) and the precipitation onto the bottom of the viahole is good. Because, as the precipitation rate becomes slow, the supplement by diffusion of metal ion is faster than reduction of metal ion in the solution and the precipitation of the plated film onto the bottom of the viahole is easy.

The precipitation rate of the plated film can be decreased to 1~2 μm/hour by adjusting the alkali compound to 0.025~0.25 mol/l and the reducing agent to 0.03~0.15 mol/l. Therefore, when the plated film is formed in the opening for theviahole by using the above electroless plating solution, copper ion can sufficiently be diffused in the opening for the viahole and hence the plated film having a sufficient thickness can be formed even in the fineviaholes.

It is desirable to adjust the specific gravity of the electroless plating solution to 1.02~1.10 for precipitating the plated film into the openings for fine viaholes.

And also, it is desirable that the temperature of the electroless plating solution is not higher than 50° C., preferably 5~40° C. When the temperature is too high, the precipitation rate is too fast and it is difficult to precipitate the plated film in the openings for fineviaholes.

Further, the electroless plating solution is desirable to contain 0.01~0.05% by weight of nickel ion, iron ion, cobalt ion or the like.

When the concentration of the nickel ion or the like is set to the above range, the content of at least one metal selected from the group consisting of nickel, iron and cobalt can be rendered into 0.1~0.5% by weight and the plated film being high in the hardness and having an excellent adhesion property to the resin insulating layer can be obtained.

In the electroless plating solution according to the invention, sodium hydroxide, potassium hydroxide, ammonia and the like are mentioned as the alkali compound.

As the reducing agent, there are mentioned formaldehyde, sodium hypophosphite, $NaBH_4$, hydrazine and the like. As the compound for forming the copper ion, there are mentioned copper sulfate, copper chloride and the like.

As the salt of tartaric acid, there are mentioned sodium salt, potassium salt and the like. In these salts, only one of two carboxyl groups may be substituted with the above metal, or the two carboxyl groups may be substituted with the metals.

Then, a plating resist is formed on the electroless plated film. As a plating resist composition, it is desirable to use a composition comprising an acrylate of cresol novolac type epoxy resin or phenol novolac type epoxy resin and an imidazole curing agent, but a commercially available dry film may be used.

(7) Next, portions not forming the plating resist are subjected to an electrolytic plating to form outer conductor circuits and viaholes. In this case, the thickness of the electrolytic plated film is desirable to be 5~30 μm.

As the electrolytic plating, it is desirable to use copper plating.

(8) After the removal of the plating resist, the electroless plated film beneath the plating resist is dissolved and removed with an etching solution such as a mixed solution of sulfuric acid and hydrogen peroxide, sodium persulfate, ammonium persulfate or the like to form independent conductor circuits.

In this case, it is desirable to wash the surface of the electroless plated film with water of not higher than 40° C. prior to the electrolytic plating. If the washing is carried out with warm water exceeding 40° C., water on the surface of the electroless plated film evaporates and hence the surface of the electroless plated film is dried and oxidized to hardly precipitate the electrolytic plated film, so that portions not existing the conductor are created in the removal of the electroless plated film at the above step (8). Such a phenomenon is remarkably observed in the land and viahole portions.

Moreover, the washing water is optimum to be not lower than 5° C. for ensuring the washing ability.

(9) Thereafter, a roughened layer is formed on the surface of the outer conductor circuit.

As the method of forming the roughened layer, there are etching treatment, polishing treatment, oxidation-reduction treatment, and plating treatment.

Among them, the oxidation-reduction treatment is conducted by using NaOH (10 g/l), NaClO$_2$ (40 g/l) and Na$_3$PO$_4$ (6 g/l) as an oxidation bath (graphitization bath) and NaOH (10 g/l) and NaBH$_4$ (5 g/l) as a reduction bath.

And also, the roughened layer made of copper-nickel-phosphorus alloy is formed by precipitation through the electroless plating treatment.

As the electroless plating solution of such an alloy, it is desirable to use a plating bath having a composition of 1~40 g/l of copper sulfate, 0.1~6.0 g/l of nickel sulfate, 10~20 g/l of citric acid, 10~100 g/l of hypophosphite, 10~40 g/l of boric acid and 0.01~10 g/l of a surfactant.

Further, the surface of the roughened layer is covered with a layer of a metal or a noble metal having an ionization tendency larger than copper but not larger than titanium.

In case of using tin, a solution of tin borofluoride-thiourea or a solution of tin chloride-thiourea is uses. In this case, Sn layer having a thickness of about 0.1~2 μm is formed by Cu—Sn substitution reaction. In case of using the noble metal, sputtering, vapor deposition and the like can be adopted.

(10) Then, an adhesive layer for electroless plating id formed on the substrate as an interlaminar resin insulating layer.

(11) Further, the above steps (3)~(8) are repeated to form a conductor circuit as an upper layer. This outermost conductor circuit is a conductor pad serving as a solder pad or aviahole.

(12) A solder resist composition is applied onto the surface of the thus obtained wiring board and dried, and a photomask depicted with an opening portion is placed on the dried coating and subjected to a light exposure and developing treatment to form an opening portion exposing the solder pad (including conductor pad andviahole) among the conductor circuits. In this case, the diameter of the opening portion can be made larger than the diameter of the solder pad to completely expose the solder pad. And also, the diameter of the opening portion can be made smaller than the diameter of the solder pas to cover the edge periphery of the solder pad with the solder resist layer. In the latter case, the solder pad can be held by the solder resist layer to prevent the peeling of the solder pad.

(13) A metal layer of "nickel-gold" is formed on the solder pad exposed from the opening portion.

It is desirable that the nickel layer is 1~7 μm and the gold layer is 0.01~0.06 μm. When the nickel layer is too thick, the increase of resistance value is caused, when it is too thin, the effect of adhering to the solder body is lowered.

(14) Then, a solder body is fed onto the solder pad exposed from the opening portion. As a method of feeding the solder body, there can be used a solder transcribing method and a solder printing method. The solder transcribing method is a method wherein a solder foil is adhered to a prepreg and etched so as to leave a portion corresponding to the opening portion to form a solder pattern as a solder carrier film, and after a flux is applied to the solder resist opening portion of the substrate, the solder carrier film is laminated so as to contact the solder pattern with the pad and heated to conduct transcription. On the other hand, the printing method is a method wherein a metal mask provided with through-hole at a position corresponding to the pad is placed on the substrate and a solder paste is printed to conduct a heating treatment.

The following examples are given in illustration of the invention and are not intended as limitations thereof.]

EXAMPLE 1

(1) An adhesive for electroless plating is prepared by mixing the followings ①~③.

①. 35 parts by weight of a resin solution dissolving 25% acrylated product of cresol novolac type epoxy resin (made by Nippon Kayaku Co., Ltd. molecular weight: 2500) in DMDG at a concentration of 80 wt % is mixed with 3.15 parts by weight of a photosensitive monomer (Aronix M315, trade name, made by Toa Gosei Co., Ltd.), 0.5 part by weight of an anti-foaming agent (S-65, trade name, made by Sannopuco) and 3.6 parts by weight of NMP under stirring.

②. 12 parts by weight of polyether sulphone (PES) is mixed with 7.2 parts by weight of epoxy resin particles (Polymerpol, trade name, made by Sanyo Kasei Co., Ltd.) having an average particle size of 1.0 μm and 3.09 parts by weight of the epoxy resin particles having an average particle size of 0.5 μm and added with 30 parts by weight of NMP, which are mixed in a beads mill under stirring.

③. 2 parts by weight of an imidazole curing agent (2E4MZ-CN, trade name, made by Shikoku Kasei Co., Ltd.) is mixed with 2 parts by weight of a photoinitiator (Irgaqua I-907, trade name, made by Ciba Geigy), 0.2 part by weight of a photosensitizer (DETX-S, trade name, made by Nippon Kayaku Co., Ltd.) and 1.5 parts by weight of NMP under stirring.

(2) A resin composition used as an underlayer insulating agent layer constituting an interlaminar resin insulating layer of two-layer structure is prepared by mixing the followings ①~③.

①. 35 parts by weight of a resin solution dissolving 25% acrylated product of cresol novolac type epoxy resin (made by Nippon Kayaku Co., Ltd. molecular weight: 2500) in DMDG at a concentration of 80 wt % is mixed with 4 parts by weight of a photosensitive monomer (Aronix M315, trade name, made by Toa Gosei Co., Ltd.), 0.5 part by weight of an anti-foaming agent (S-65, trade name, made by Sannopuco) and 3.6 parts by weight of NMP under stirring.

②. 12 parts by weight of polyether sulphone (PES) is mixed with 14.49 parts by weight of epoxy resin particles (Polymerpol, trade name, made by Sanyo Kasei Co., Ltd.) having an average particle size of 0.5 μm and added with 30 parts by weight of NMP, which are mixed in a beads mill under stirring.

③. 2 parts by weight of an imidazole curing agent (2E4MZ-CN, trade name, made by Shikoku Kasei Co., Ltd.) is mixed with 2 parts by weight of a photoinitiator (Irgaqua I-907, trade name, made by Ciba Geigy), 0.2 part by weight of a photosensitizer (DETX-S, trade name, made by Nippon Kayaku Co., Ltd.) and 1.5 parts by weight of NMP under stirring.

(3) A resin filler is prepared by mixing the followings ① and ②.

①. 100 parts by weight of bisphenol F-type epoxy monomer (YL983U, trade name, made by Yuka Shell Co., Ltd. molecular weight: 310), 170 parts by weight of SiO2 spherical particles coated with a silane coupling agent and having an average particle size of 1.6 μm (CRS 1101-CE, trade name, made by Admatech Co., Ltd. A maximum particle size is not more than thickness (15 μm) of an innerlayer copper pattern as mentioned later) and 1.5 parts by weight of a leveling agent (Prenol S4, trade name, made by Sannopuco) are kneaded through three rolls to adjust a viscosity of the resulting mixture to 45,000~49,000 cps at 23±1° C.

②. 6.5 parts by weight of an imidazole curing agent (2E4MZ-CN, trade name, made by Shikoku Kasei Co., Ltd.)

Figure 1:
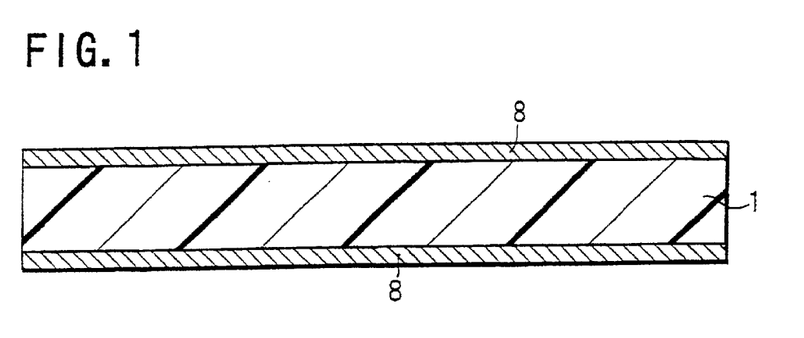
FIG. 1 is a diagrammatic view illustrating a production step in an embodiment of the multilayer printed wiring board according to the invention.

(4) There is provided a copper clad laminate obtained by laminating copper foils 8 of 18 μm in thickness onto both surfaces of a substrate 1 made of a glass epoxy resin or BT (bismaleimide triazine) resin having a thickness of 1 mm as a starting material (see FIG. 1). At first, the copper clad laminate is drilled and a plating resist is formed thereon and subjected to an electroless plating treatment to form a through-hole 9, and further the copper foil 8 is etched in a pattern form according to usual manner to from innerlayer copper patterns 4 on both surfaces of the substrate 1.

Figure 2:
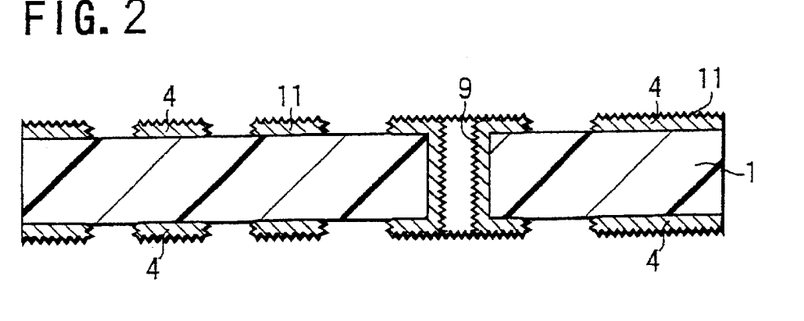
FIG. 2 is a diagrammatic view illustrating a production step in an embodiment of the multilayer printed wiring board according to the invention.
Figure 3:
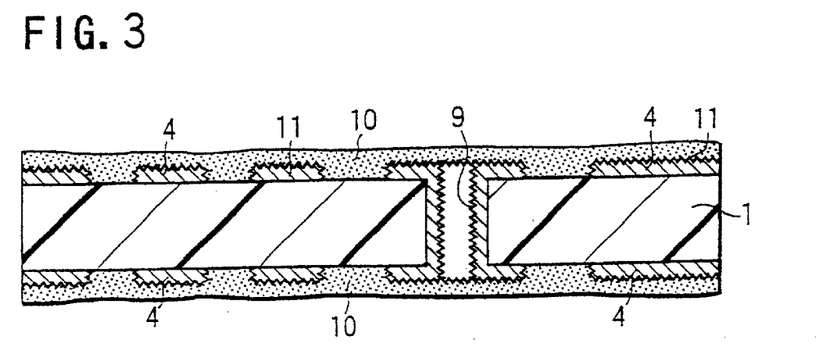
FIG. 3 is a diagrammatic view illustrating a production step in an embodiment of the multilayer printed wiring board according to the invention.

(5) The substrate provided with the innerlayer copper pattern 4 and the through-hole 9 is washed with water, dried and subjected to an oxidation-reduction treatment using NaOH (10 g/l), NaClO$_2$ (40 g/l) and Na$_3$PO$_4$ (6 g/l) as an oxidation bath (graphitization bath) and NaOH (10 g/l) and NaBH$_4$ (6 g/l) as a reduction bath to from a roughened layer 11 over a full surface of the innerlayer copper pattern 4 and the through-hole 9 (see FIG. 2).

(6) The resin filler 10 is applied to a surface of the substrate by means of a coater to fill between the conductor circuits 4 and in the through-hole 9 and dried at 70° C. for 20 minutes, and also the resin filler 10 is filled between the conductor circuits 4 and in the through-hole 9 at the other surface of the substrate and dried at 70° C. for 20 minutes.

(7) A one-side surface of the substrate after the completion of the treatment in the item (6) is polished by a belt sander polishing so as not to leave the resin filler 10 on the surface of the innerlayer copper pattern 4 and a land surface of the through-hole 9 and then buffed with an alumina abrasive grains for removing the damage due to the belt sander polishing. Such a series of the polishing is applied to the other surface of the substrate.

Figure 4:
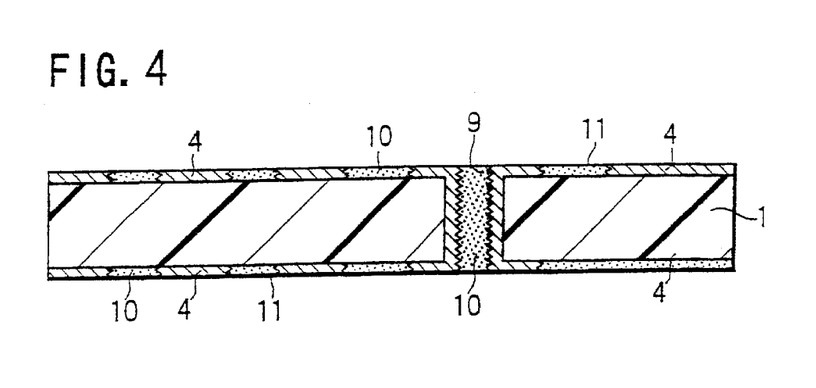
FIG. 4 is a diagrammatic view illustrating a production step in an embodiment of the multilayer printed wiring board according to the invention.

Then, the substrate is subjected to a heating treatment at 100° C. for 1 hour, 120° C. for 3 hours, 150° C. for 1 hour and 180° C. for 7 hours to cure the resin filler (see FIG. 4).

Then, the roughened layer 11 on the surface layer portion of the resin filler 10 filled in the through-hole 9 or the like and the upper surface of the innerlayer conductor circuit 4 is removed to smoothen both surfaces of the substrate to thereby obtain a wiring board wherein the resin filler 10 and side face of the innerlayer conductor circuit 4 are strongly adhered to each other through the roughened layer 11 and the inner wall face of the through-hole 9 and the rein filler 10 are strongly adhered to each other through the roughened layer 11. That is, the surface of the resin filler 10 and the surface of the innerlayer copper pattern 4 are the same plane at this step. In this case, the cured resin filled has a Tg point of 155.6° C. and a linear thermal expansion coefficient of 44.5×10$^6$/° C.

Figure 5:
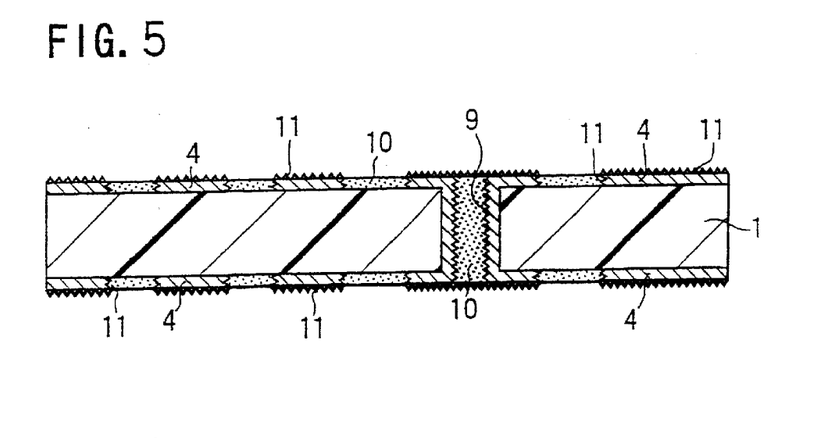
FIG. 5 is a diagrammatic view illustrating a production step in an embodiment of the multilayer printed wiring board according to the invention.

(8) A roughened layer 11 comprised of Cu—Ni—P alloy coated layer having a thickness of 5 μm and Cu—Ni—P needle-shaped alloy layer having a thickness of 2 μm is formed on the innerlayer conductor circuit 4 and land upper surface of the through-hole 9 exposed by the treatment of the item (7), and Sn metal coated layer having a thickness of 0.3 μm is formed on the surface of the roughened layer 11 (see FIG. 5, provided that the Sn metal coated layer is not shown).

The formation method is as follows. That is, the substrate is acidically degreased, soft-etched and treated with a catalyst solution containing palladium chloride and an organic acid to give a palladium catalyst, and after the catalyst is activated, the substrate is immersed in an aqueous electroless plating solution of pH=9 containing 8 g/l of copper sulfate, 0.6 g/l of nickel sulfate, 15 g/l of citric acid, 29 g/l of sodium hypophosphite, 31 g/l of boric acid and 0.1 g/l of a surfactant, which is rocked once every 4 second in a vertical direction and air is bubbled after 3 minutes to precipitate a plated layer of Cu—Ni—P non-needle alloy on the copper conductor circuit 4 and land surface of the through-hole 9 and then Cu—Ni—P needle-shaped alloy is precipitated thereon to form a roughened layer 11. Further, it is heated at 100° C. for 30 minutes, 120° C. for 30 minutes and 150° C. for 2 hours, treated with an aqueous solution of 10% by weight of sulfuric acid and an aqueous solution of 0.2 mol/l of borofluoric acid and subjected to Cu—Sn substitution reaction under conditions of tin borofluoride: 0.1 mol/l, thiourea: 1.0 mol/l, temperature: 50° C. and pH=1.2 to form Sn metal coated layer of 0.3 μm on the surface of the roughened layer 11 (Sn metal coated layer is not shown).

(9) The interlaminar resin insulating agent of the above item (2) (viscosity: 1.9 Pa·s) is applied onto both surfaces of the substrate treated in the above item (8) by means of a roll coater, left to stand at a horizontal state for 20 minutes and dried (prebaked) at 60° C. for 30 minutes to form an insulating agent layer 2a.

Figure 6:
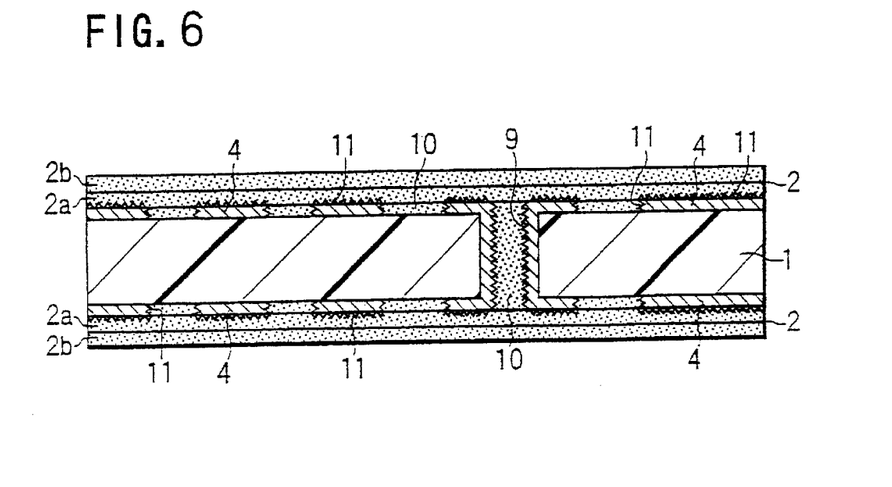
FIG. 6 is a diagrammatic view illustrating a production step in an embodiment of the multilayer printed wiring board according to the invention.

Onto the insulating agent later 2a is applied the adhesive for electroless plating in the above item (1) (viscosity: 1.0 Pa·s) by means of a roll coater, which is left to stand at a horizontal state for 20 minutes and dried (prebaked) at 60° C. for 30 minutes to form an adhesive layer 2b, whereby an interlaminar resin insulating layer 2 having a thickness of 40 μm and a two-layer structure is formed on each surface of the substrate (see FIG. 6).

Figure 7:
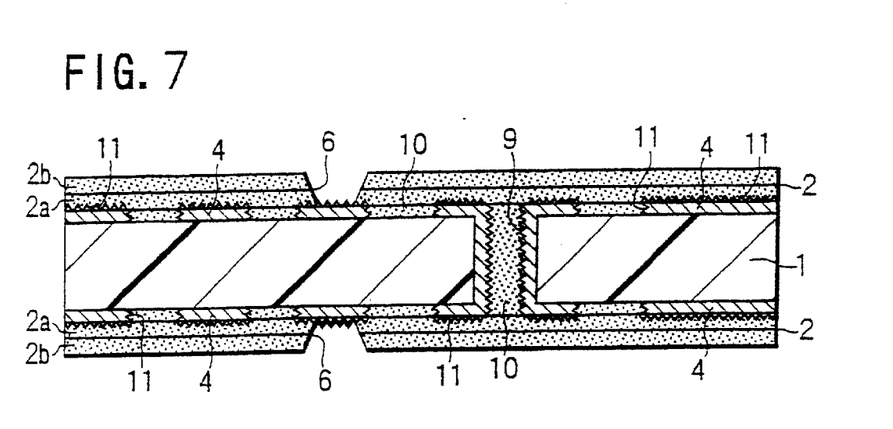
FIG. 7 is a diagrammatic view illustrating a production step in an embodiment of the multilayer printed wiring board according to the invention.

(10) Onto both surfaces of the substrate provided with the interlaminar resin insulating layer 2 in the item (9) is adhered a photomask depicted with black circle of 85 μmφ, which is exposed to a super-high pressure mercury lamp at 500 mJ/cm$^2$. It is developed by spraying DMDG solution to form an opening 6 for viahole of 85 μmφ in the interlaminar resin insulating layer 2. Further, the substrate is exposed to a super-high pressure mercury lamp at 3000 mJ/cm$^2$ and subjected to a heating treatment (post baking) at 100° C. for 1 hour and 150° C. for 5 hours to form the interlaminar resin insulating layer (two-layer structure) 2 of 35 μm in thickness having the opening (opening for the formation of viahole) 6 with an excellent size accuracy corresponding to the photomask (see FIG. 7). Moreover, the tin plated layer is locally exposed in the opening for viahole.

Figure 8:
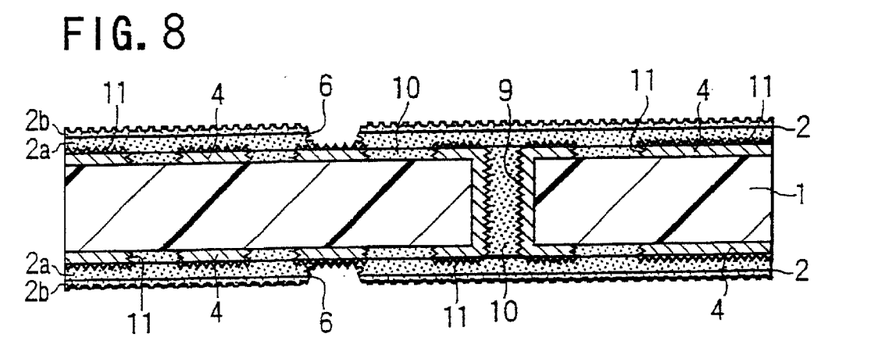
FIG. 8 is a diagrammatic view illustrating a production step in an embodiment of the multilayer printed wiring board according to the invention.

(11) The substrate provided with the opening for the formation of viahole is immersed in 800 g/l of chromic acid at 70° C. for 19 minutes to dissolve and remove epoxy resin particles existing on the surface of the adhesive layer 2b of the interlaminar resin insulating layer 2 to roughen the surface of the interlaminar resin insulating layer 2 (roughened depth: 3.5 μm), which is then immersed in a neutral solution (made by Shipley) and washed with water (see FIG. 8).

Furthermore, a palladium catalyst (made by Atotech) is applied onto the roughened surface of the substrate to give a catalyst nucleus to the surface of the interlaminar resin insulating layer 2 and the inner wall face of the opening 6 forviahole.

Figure 9:
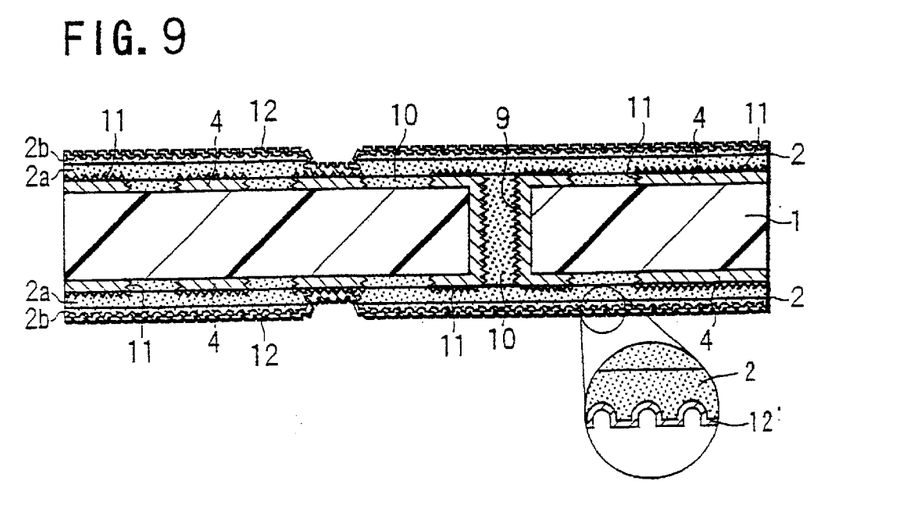
FIG. 9 is a diagrammatic view illustrating a production step in an embodiment of the multilayer printed wiring board according to the invention.

(12) The substrate is immersed in an electroless copper plating bath having the following composition to form an electroless copper plated film 12 having a thickness of 0.6 μm on a whole of the roughened surface (see FIG. 9). In this case, the electroless plated film is thin, so that irregularities are observed on the surface of the film.

| [Aqueous electroless plating solution] | |
| --- | --- |
| NiSO$_4$ | 0.003 mol/l |
| tartaric acid | 0.20 mol/l |
| copper sulfate | 0.03 mol/l |
| HCHO | 0.05 mol/l |
| NaOH | 0.10 mol/l |
| α,α'-bipirydyl | 40 mg/l |
| polyethylene glycol (PEG) | 0.1 g/l |
| [Electroless plating condition] | |
| liquid temperature of 33° C. | |

Figure 10:
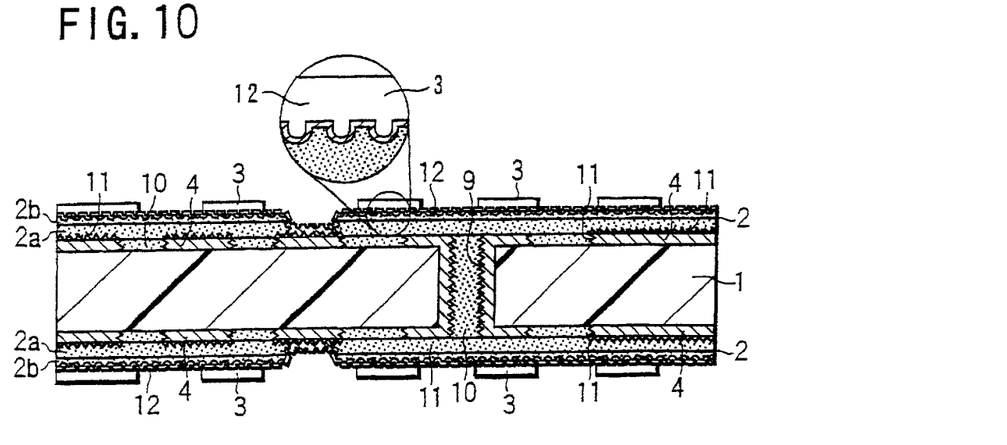
FIG. 10 is a diagrammatic view illustrating a production step in an embodiment of the multilayer printed wiring board according to the invention.

(13) A commercially available photosensitive dry film is laid on the electroless copper plated film 12 formed in the item (12) and a mask is placed thereon, which is exposed to a light at 100 mJ/cm$^2$ and developed with 0.8% sodium carbonate to form a plating resist 3 having a thickness of 15 μm (see FIG. 10).

Figure 11:
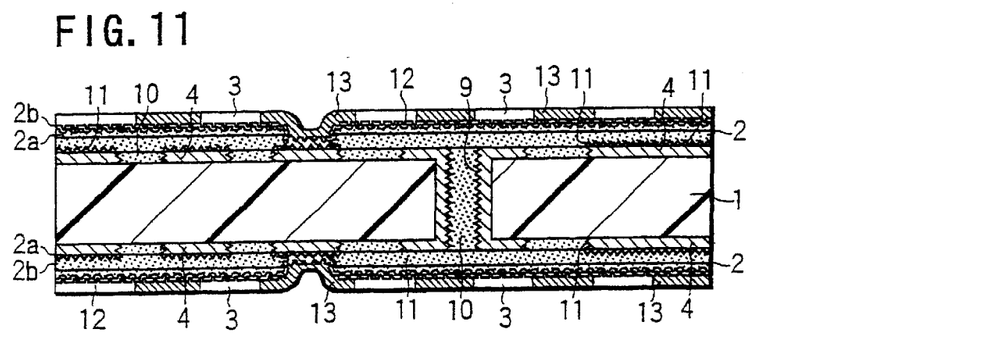
FIG. 11 is a diagrammatic view illustrating a production step in an embodiment of the multilayer printed wiring board according to the invention.

(14) Then, portions not forming the resist are subjected to an electrolytic copper plating under the following conditions to form an electrolytic copper plated film 13 having a thickness of 15 μm (see FIG. 11).

| [Aqueous electrolytic plating solution] | |
| --- | --- |
| sulfuric acid | 180 g/l |
| copper sulfate | 80 g/l |
| additive (Caparasid GL, trade name, made by Atotech Japan) | 1 ml/l |
| [Electrolytic plating condition] | |
| current density | 1 A/dm$^2$ |
| time | 30 minutes |
| temperature | room temperature |

Figure 12:
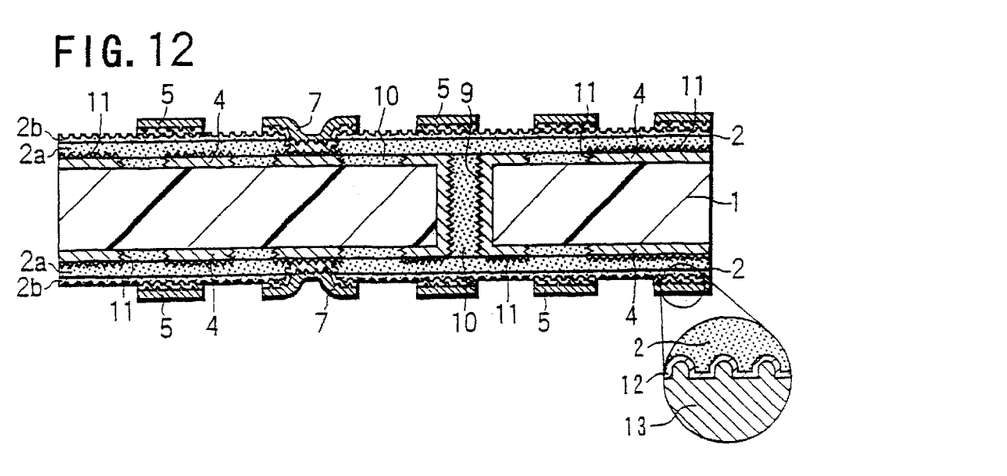
FIG. 12 is a diagrammatic view illustrating a production step in an embodiment of the multilayer printed wiring board according to the invention.

(15) After the plating resist 3 is peeled and removed with 5% KOH, the electroless plated film 12 beneath the plating resist 3 is dissolved and removed by etching with a mixed solution of sulfuric acid and hydrogen peroxide to form conductor circuits (including viahole) comprised of the electroless copper plated film 12 and the electrolytic copper plated film 13 and having a thickness of 15 μm (see FIG. 12).

In the thus produced printed wiring board, the adhesion property between the plating resist and the electroless plated film is good, and short-circuit between the conductor circuits is not observed.

In the heat cycle test of −55°~125° C., the peeling at the boundary face between the electroless plated film and the electrolytic plated film constituting the conductor circuit is not observed.

COMPARATIVE EXAMPLE 1

The same procedure as in Example 1 is repeated except that Buildcopper, trade name, made by Okuno Seiyaku Co., Ltd. is used as an electroless plating solution.

| [Aqueous electrolytic plating solution] | |
| --- | --- |
| EDTA | 150 g/l |
| copper sulfuric | 20 g/l |
| HCHO | 30 g/l |
| NaOH | 40 g/l |
| α,α'-bipirydyl | 40 mg/l |
| PEG | 0.1 g/l |
| [Electroless plating condition] | |
| liquid temperature of 70° C. | |
| for 30 minutes | |
| speed of precipitation | 6 μm/hour |

REFERENCE EXAMPLE 1

The same procedure as in Example 1 is repeated except that the average diameter of the opening for theviahole is 100 μm and Buildcopper, trade name, made by Okuno Seiyaku Co., Ltd. is used as an electroless plating solution.

With respect to the wiring boards obtained in Example 1, Comparative Example 1 and Reference Example 1, the presence or absence of peeling at the boundary face between the electroless plated film and the electrolytic plated film constituting the conductor circuit is examined by a heat cycle test of −55° C.~125° C.

And also, the presence or absence of wiring breakage in the viahole portion is measured by observing the section by means of an optical microscope. The results are shown in Table 1.

TABLE 1

| | Peeling by heat cycle test | Wiring breakage in viahole portion |
| --- | --- | --- |
| Example 1 | absence | absence |
| Comparative Example 1 | absence | presence |
| Reference Example 1 | absence | absence |

INDUSTRIAL APPLICABILITY

As mentioned above, according to the invention, the peeling of the plating resist can surely be prevented in the production step of the printed wiring board through the semi-additive method, and the peeling produced at the boundary face between the electroless plated film and the electrolytic plated film constituting the conductor circuit through heat cycle, thermal shock or the like can surely be prevented and the connection reliability in the fine viahole can be ensured.

Therefore, the printed wiring board according to the invention and the method of producing the same indicate an excellent applicability in many fields requiring high performance and high densification of electronic parts.

What is claimed is:

1. A multilayer printed wiring board comprising a substrate provided with inner conductor circuits, interlaminar resin insulating layers formed thereon and outer conductor circuits and viaholes formed in the interlaminar resin insulating layers, wherein a roughened surface is formed on the surface of the interlaminar resin insulating layer, the outer conductor circuit is comprised of an electroless plated film formed following the roughened surface and an electrolytic plated film formed on the electroless plated film and the viahole has an average diameter of not more than 90 $\mu$m, and a thickness of the electroless plated film at the bottom of the viahole is 50~100% of a thickness of the electroless plated film at the surface of the interlaminar resin insulating layer.

2. A printed wiring board according to claim 1, wherein the electroless plated film has a thickness of 0.1~5 $\mu$m and the electrolytic plated film has a thickness of 5~30 $\mu$m.

3. A printed wiring board according to claim 1, wherein the surface of the outer conductor circuit and the inner conductor circuit is roughened.

4. A method of producing a multilayer printed wiring board, which comprises forming an interlaminar resin insulating layer on a substrate provided with inner conductor circuits, forming an opening having an average diameter of not more than 90 $\mu$m in the interlaminar resin insulating layer, roughening the surface of the interlaminar resin insulating layer, subjecting the interlaminar resin insulating layer to an electroless plating to form an electroless plated film so as to follow the roughened surface on the surface of the interlaminar resin insulating layer, and at the same time subjecting the inside of the opening to an electroless plating to adjust a thickness of the electroless plated film at the bottom of a viahole to 50~100% of a thickness of the electroless plated film on the surface of the interlaminar resin insulating layer, forming a plating resist, subjecting portions not forming the plating resist to an electrolytic plating, removing the plating resist, and removing the electroless plated film beneath the plating resist through etching to form an outer conductor circuit and viaholes comprised of the electroless plated film and the electrolytic plated film.

5. A printed wiring board according to claim 2, wherein the electroless plated film has a thickness of 0.5~5 $\mu$m and the electrolytic plated film has a thickness of 5~30 $\mu$m.

6. A printed wiring board according to claim 2, wherein the electroless plated film has a thickness of 0.1~5 $\mu$m and the electrolytic plated film has a thickness of 10~20 $\mu$m.

7. A printed wiring board according to claim 2, wherein the electroless plated film has a thickness of 0.5~5 $\mu$m and the electrolytic plated film has a thickness of 10~20 $\mu$m.

8. A printed wiring board according to claim 3, wherein the surface of the outer conductor circuit and the inner conductor circuit is roughened to form a roughened alloy layer made of copper-nickel-phosphorus.

9. A printed wiring board according to claim 8, wherein the alloy layer is a needle-shaped layer.

10. A printed wiring board according to claim 8, wherein the alloy layer has a ratio of copper to nickel to phosphorus of 90–96 wt. % to 1–5 wt. % to 0.5–2 wt. %.

11. A printed wiring board according to claim 8, wherein the roughened alloy layer is formed by an etching treatment.

12. A printed wiring board according to claim 8, wherein the roughened alloy layer is formed by a polishing treatment.

13. A printed wiring board according to claim 8, wherein the roughened alloy layer is formed by an oxidation treatment.

14. A printed wiring board according to claim 8, wherein the roughened alloy layer is formed by a plated film.

* * * * *